US010574150B2

(12) United States Patent
Yamanaka et al.

(10) Patent No.: US 10,574,150 B2
(45) Date of Patent: Feb. 25, 2020

(54) POWER CONVERSION APPARATUS, METHOD FOR MANUFACTURING POWER CONVERSION APPARATUS, AND ELECTRIC APPLIANCE

(71) Applicant: KABUSHIKI KAISHA YASKAWA DENKI, Kitakyushu-shi (JP)

(72) Inventors: Yasunori Yamanaka, Kitakyushu (JP); Junichi Yokoyama, Kitakyushu (JP); Satoru Kawano, Kitakyushu (JP)

(73) Assignee: KABUSHIKI KAISHA YASKAWA DENKI, Kitakyushu-shi (JP)

( * ) Notice: Subject to any disclaimer, the term of this patent is extended or adjusted under 35 U.S.C. 154(b) by 0 days.

(21) Appl. No.: 15/172,285

(22) Filed: Jun. 3, 2016

(65) Prior Publication Data
US 2016/0359317 A1   Dec. 8, 2016

(30) Foreign Application Priority Data
Jun. 5, 2015  (JP) .................................. 2015-115301

(51) Int. Cl.
*H02M 7/00* (2006.01)
*H05K 3/30* (2006.01)
*H01R 9/24* (2006.01)
*H01R 13/713* (2006.01)
*H01R 13/66* (2006.01)

(52) U.S. Cl.
CPC .......... *H02M 7/003* (2013.01); *H01R 9/2425* (2013.01); *H05K 3/30* (2013.01); *H01R 13/6683* (2013.01); *H01R 13/7137* (2013.01)

(58) Field of Classification Search
CPC ...... H02M 7/003; H02M 1/32; H01R 9/2425; H01R 9/245; H01R 13/7137; H01R 13/6683; H05K 3/30; H02H 7/122
See application file for complete search history.

(56) References Cited

U.S. PATENT DOCUMENTS

| 9,000,553 | B2* | 4/2015 | Tokuyama | ............ | H01L 25/072 |
|           |     |        |          |              | 257/499 |
| 2010/0023286 | A1* | 1/2010 | Rodseth | ................. | G01R 31/07 |
|           |     |        |          |              | 702/65 |
| 2011/0304943 | A1* | 12/2011 | Barton | ................... | H02H 9/042 |
|           |     |        |          |              | 361/104 |

(Continued)

FOREIGN PATENT DOCUMENTS

| JP | 2003-203689 A | 7/2003 |
| JP | 2008-193865 A | 8/2008 |

(Continued)

OTHER PUBLICATIONS

Office Action dated Nov. 10, 2016 in Japanese Patent Application No. 2015-115301 (with unedited computer generated English translation).

*Primary Examiner* — Kyle J Moody
(74) *Attorney, Agent, or Firm* — Oblon, McClelland, Maier & Neustadt, L.L.P.

(57) ABSTRACT

A power conversion apparatus includes: a board; a first electronic component disposed on a first surface of the board; and a temperature sensor disposed on a second surface of the board which is opposite to the first surface. The power conversion apparatus may further include a first heat conductive member disposed between the first electronic component and the temperature sensor.

13 Claims, 9 Drawing Sheets

(56) References Cited

U.S. PATENT DOCUMENTS

2017/0141674 A1* 5/2017 Mutsuura ............... H02M 1/08

FOREIGN PATENT DOCUMENTS

| JP | 2012-014848 A | 1/2012 |
|---|---|---|
| JP | 2013-211950 A | 10/2013 |
| JP | 2013-247099 A | 12/2013 |
| JP | 2014-146545 A | 8/2014 |

* cited by examiner

POWER CONVERSION APPARATUS, METHOD FOR MANUFACTURING POWER CONVERSION APPARATUS, AND ELECTRIC APPLIANCE

CROSS-REFERENCE TO RELATED APPLICATION

This application claims priority from Japanese Patent Application No. 2015-115301 filed with the Japan Patent Office on Jun. 5, 2015, the entire content of which is hereby incorporated by reference.

BACKGROUND

1. Technical Field

An embodiment of the present disclosure relates to a power conversion apparatus, a method for manufacturing the power conversion apparatus, and an electric appliance.

2. Description of the Related Art

JP-A-2012-014848 has disclosed the method of detecting the heat generation of a terminal block mounted on a board. In this detection method, the heat conductive terminal plate, the heat sensitive element, and the detector are used. The heat conductive terminal plate has one end thereof fixed to the terminal block and the other end fixed to the board. The heat conductive terminal plate conducts heat generated from the terminal block to the board. The heat sensitive element is disposed near the heat conductive terminal plate on the board. The heat sensitive element detects the heat conducting to the board and outputs the corresponding heat detection output. The detector detects the heat generated from the terminal block on the basis of the output of the heat sensitive element.

SUMMARY

A power conversion apparatus includes: a board; a first electronic component disposed on a first surface of the board; and a temperature sensor disposed on a second surface of the board which is opposite to the first surface.

DESCRIPTION OF THE EMBODIMENTS

Figure 1:
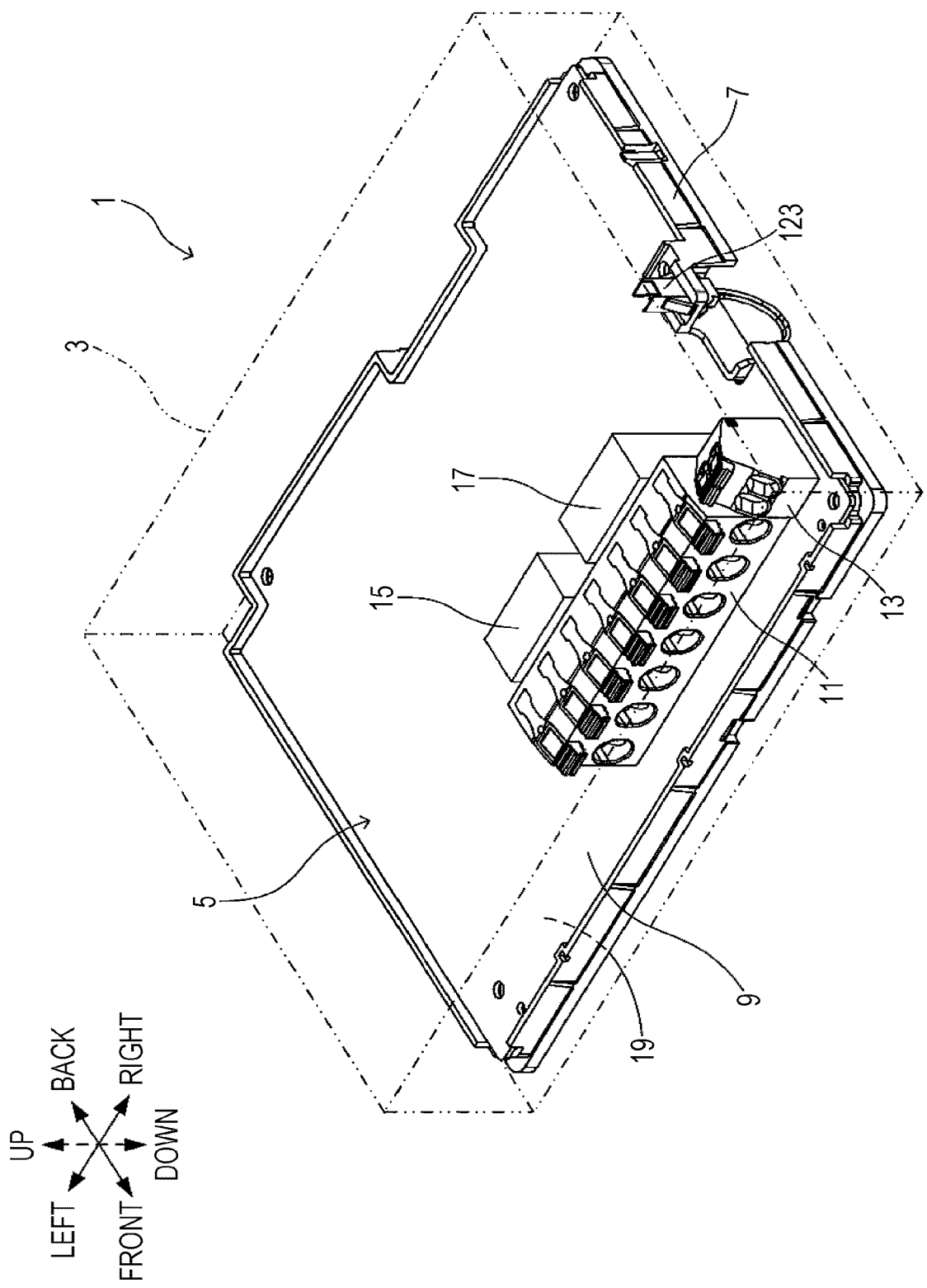
FIG. 1 is a perspective view illustrating schematically an example of a power conditioner apparatus according to an embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A power conversion apparatus according to one aspect of the present disclosure includes: a board; a first electronic component disposed on a first surface of the board; and a temperature sensor disposed on a second surface of the board which is opposite to the first surface.

A power conversion apparatus according to another aspect of the present disclosure includes: a board; a first electronic component disposed on a first surface of the board; a converter that is disposed on the first surface and converts DC power into AC power; and a temperature sensor disposed on a second surface of the board which is opposite to the first surface.

A method for manufacturing a power conversion apparatus according to another aspect of the present disclosure includes: preparing a board including a first surface provided with a terminal block including a plurality of terminals; attaching a plurality of temperature fuses to a temperature fuse cover; and disposing the temperature fuse cover on a second surface side of the board, which is opposite to the first surface, so that each of the plurality of temperature fuses is disposed on the second surface of the board at a position corresponding to each of the plurality of terminals.

An electric appliance according to another aspect of the present disclosure includes: a board; a first electronic component disposed on a first surface of the board; a converter that converts DC power into AC power; and a temperature sensor disposed on a second surface of the board which is opposite to the first surface.

According to the aspect of the present disclosure, the degree of freedom in designing the board of the electric appliance can be improved.

An embodiment will be described with reference to the drawings. The terms of defining directions including the horizontal, vertical, right, and left directions will be used to describe the structure of the electric appliance, for example. However, these directions will not limit the positional relation of the structures in the electric appliance and the like.

1. Power Conditioner Apparatus

This embodiment will describe a power conditioner apparatus corresponding to one example of the power conversion apparatus.

As illustrated in FIG. 1, a power conditioner apparatus 1 according to this embodiment includes a case 3 constituting a contour. In FIG. 1, the case 3 is shown by an imaginary line (two-dot chain line) in order to clarify the internal structure. The case 3 houses a printed board 5 (one example of the board) and a printed board support bracket 7 for supporting and fixing the printed board 5. A plurality of electronic components is mounted on a front surface 9 (one example of the first surface) corresponding to one surface (in this example, upper surface) of the printed board 5. The plurality of electronic components includes, for example, two terminal blocks 11 and 13 (one example of the first electronic component), a DC-side surge suppression circuit 15, and an AC-side surge suppression circuit 17. The DC-side surge suppression circuit 15 and the AC-side surge suppression circuit 17 are disposed close to the terminal block 11 (in this example, close to the rear side of the terminal block 11). Although FIG. 1 does not illustrate, other electronic components are mounted on the front surface 9 of the printed board 5.

The terminal block 11 is used for the system interconnection. The terminal block 13 is used for the isolated operation. The system interconnection refers to the connection between the commercial power source and the power generated by the photovoltaic power generation. The isolated operation refers to the operation on the power generated by the photovoltaic power generation when the commercial power source has stopped. On a back surface 19 (one example of the second surface) (in this example, the lower surface) of the printed board 5 opposite to the front surface 9 is provided a plurality of temperature fuses 21 (one example of the temperature sensor) and this will be described below in detail. The temperature fuses 21 can detect the temperature corresponding to the heat generated in each of the terminal blocks 11 and 13.

2. Photovoltaic Power Generation System

Figure 2:
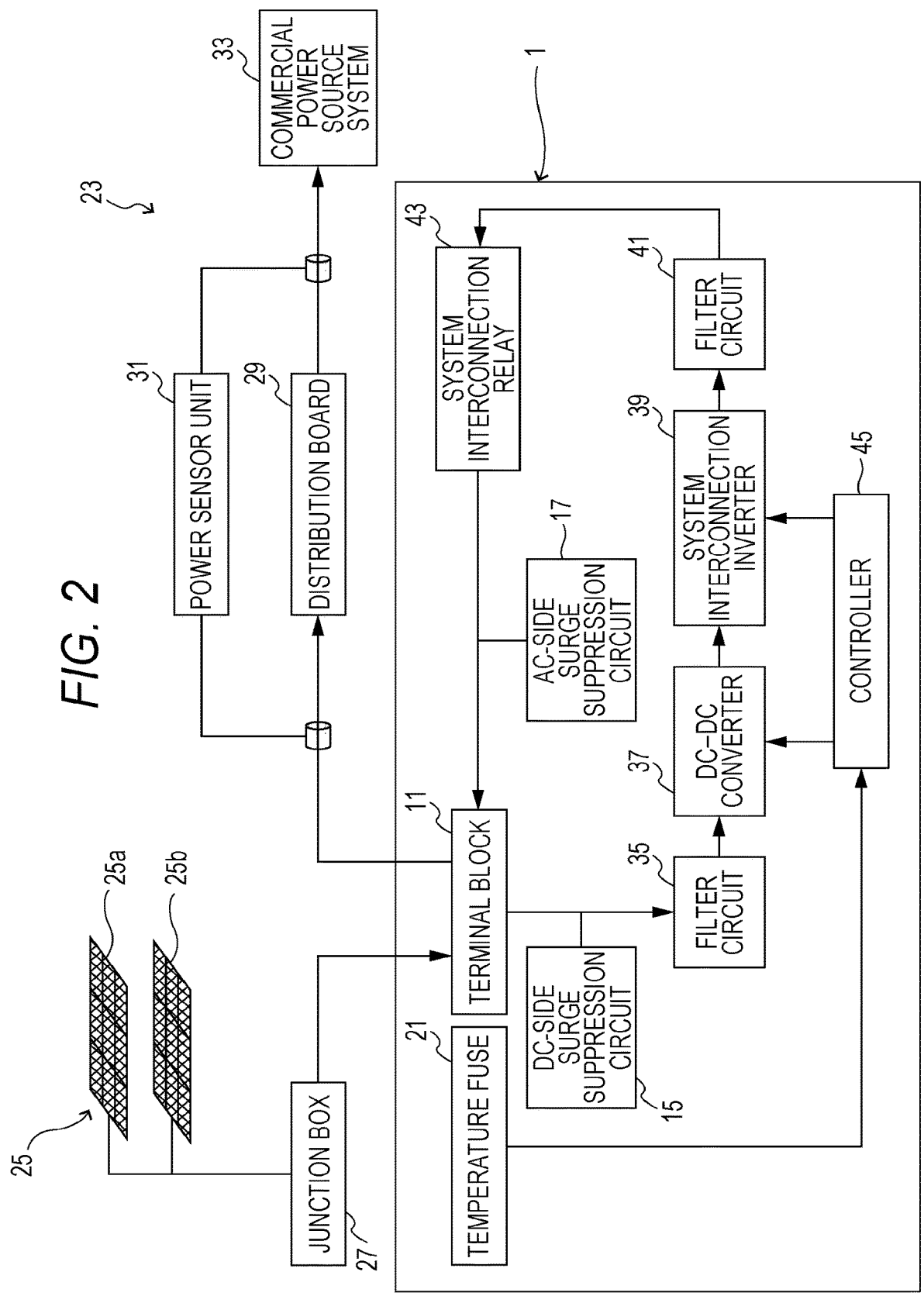
FIG. 2 is an explanatory view illustrating an example of a system structure of a photovoltaic power generation system.

Next, description is made of an example of the system structure of a photovoltaic power generation system 23 including the power conditioner apparatus 1 with reference to FIG. 2.

As illustrated in FIG. 2, the photovoltaic power generation system 23 includes a photovoltaic array 25, a junction box 27, the power conditioner apparatus 1, a distribution board 29, and a power sensor unit 31.

The photovoltaic array 25 includes a plurality of photovoltaic modules 25a and 25b as a DC power generation apparatus. Although the number of photovoltaic modules is two in the example illustrated in FIG. 2, the number thereof may be either one or three or more. The junction box 27 collects the wires from the photovoltaic array 25 into two sets of wires. The power conditioner apparatus 1 converts DC power, which is supplied from the photovoltaic array 25 through the junction box 27, into AC power. The distribution board 29 is provided on the output side of the power conditioner apparatus 1. The power sensor unit 31 detects the power flowing in the distribution board 29. The photovoltaic power generation system 23 with such a structure can supply the power generated in the photovoltaic array 25 back to a commercial power source system 33.

The power conditioner apparatus 1 includes the terminal block 11, a filter circuit 35, a DC-DC converter 37, a system interconnection inverter 39, a filter circuit 41, a system interconnection relay 43, the DC-side surge suppression circuit 15, the AC-side surge suppression circuit 17, the temperature fuses 21, and a controller 45. In FIG. 2, the structure related to the isolated operation (including the terminal block 13) is not illustrated.

The terminal block 11 is connected to the wires from the photovoltaic array 25 and to the wires to the distribution board 29 and the like. The filter circuit 35 suppresses the electric noise of the DC output power supplied from the photovoltaic array 25 through the terminal block 11. The DC-DC converter 37 boosts the voltage of the DC output power from the filter circuit 35. The system interconnection inverter 39 (one example of the converter for converting DC power into AC power) converts the DC output power from the DC-DC converter 37 into AC power in accordance with the frequency of the commercial power source system 33. The filter circuit 41 suppresses the electric noise of the AC power output from the system interconnection inverter 39. The system interconnection relay 43 connects or disconnects between the power conditioner apparatus 1 and the commercial power source system 33.

The DC-side surge suppression circuit 15 is provided between the terminal block 11 and the filter circuit 35. The DC-side surge suppression circuit 15 suppresses the surge such as thunder from the photovoltaic array 25 through the wires. The AC-side surge suppression circuit 17 is provided between the terminal block 11 and the system interconnection relay 43. The AC-side surge suppression circuit 17 suppresses the surge such as thunder from the commercial power source system 33 through the wires. The temperature fuses 21 are provided on the back surface 19 of the printed board 5 at the positions corresponding to the terminal blocks 11 and 13. The temperature fuses 21 will blow when the temperature which increases due to the heat generated in the terminal blocks 11 and 13 reaches a predetermined value or more. Upon the detection that the temperature fuses 21 have blown, the controller 45 deactivates the DC-DC converter 37 and the system interconnection inverter 39 by outputting a stop signal to the DC-DC converter 37 and the system interconnection inverter 39. Thus, the controller 45 protects the terminal blocks 11 and 13 from overheat.

Although not shown, the DC-side surge suppression circuit 15 and the AC-side surge suppression circuit 17 may have a circuit structure including electronic components such as a varistor, a fuse, and an arrester (examples of the second electronic component).

3. Internal Structure of Power Conditioner Apparatus

Next, one example of the internal structure of the power conditioner apparatus 1 is described with reference to FIG. 3. Note that FIG. 3 does not illustrate the other components mounted on the printed board than the terminal blocks 11 and 13.

Figure 3:
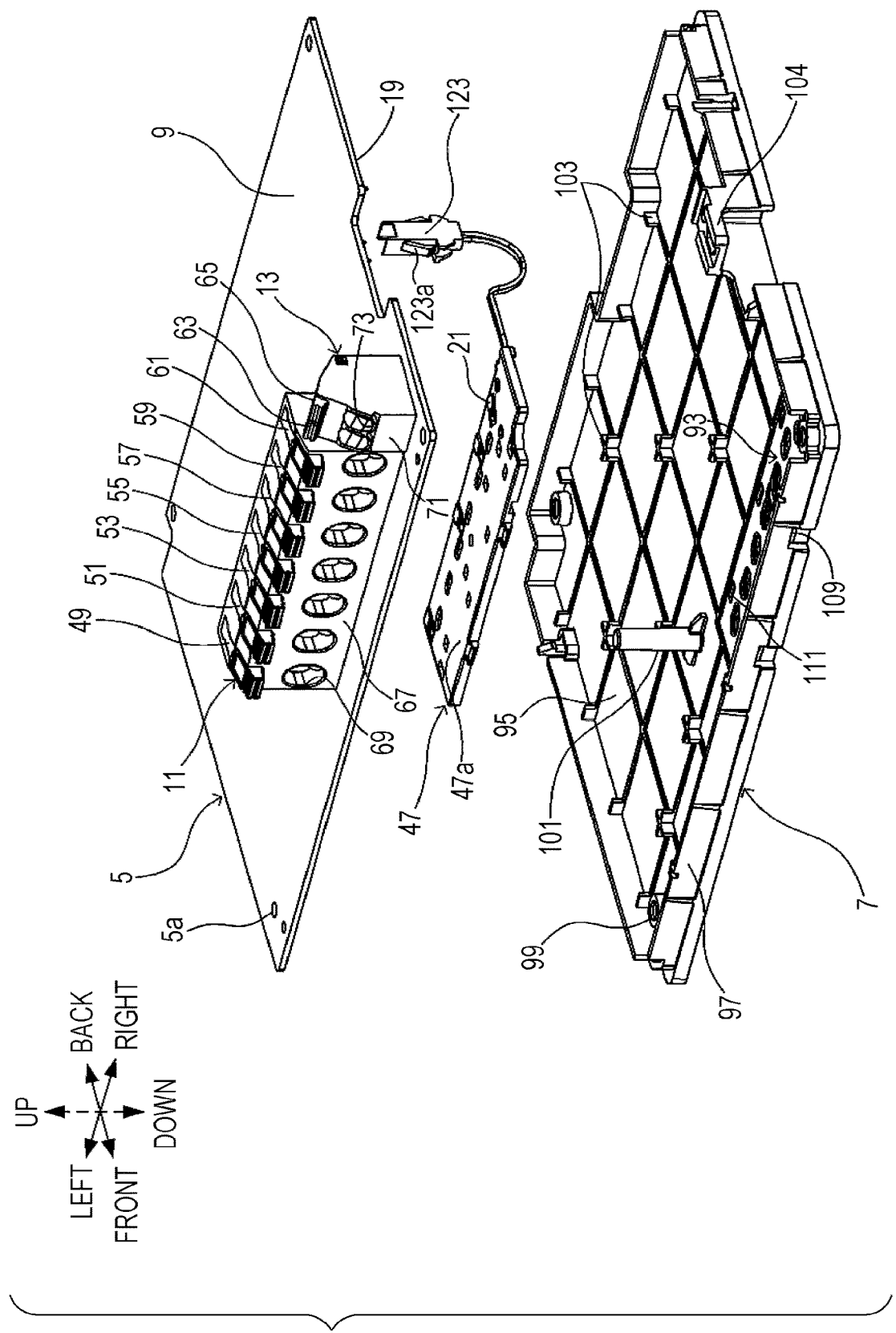
FIG. 3 is an exploded perspective view illustrating an example of an internal structure of the power conditioner apparatus.

As illustrated in FIG. 3, the power conditioner apparatus 1 includes the printed board 5, the printed board support bracket 7, a temperature fuse cover 47, and the like on the inside. The printed board 5 has, for example, an approximately rectangular shape. The printed board support bracket 7 has, for example, an approximately rectangular shape. The printed board 5 is placed and fixed over the printed board support bracket 7 with the temperature fuse cover 47 interposed therebetween.

Near the end of the front surface 9 of the printed board 5 (in this example, near the right front corner) are provided the terminal blocks 11 and 13. The terminal block 11 includes a plurality of terminals. In this example, the terminal block 11 includes DC-side input terminals 49 and 51, ground terminals 53 and 55, and AC-side output terminals 57, 59, and 61. To the input terminals 49 and 51, two wires used to input DC power from the photovoltaic array 25 and collected in the junction box 27 are connected. The ground terminals 53 and 55 are connected to two ground wires. The output terminals 57, 59, and 61 are connected to three wires of U-phase, O-phase, and W-phase with which the AC power generated by being converted from the DC power is output to the distribution board 29.

The terminal block 13 includes a plurality of terminals. The terminal block 13 includes AC-side output terminals 63 and 65 in this example. The output terminals 63 and 65 are connected to the two wires used to output the AC power in the isolated operation to the emergency outlet. The terminal block 11 and the terminal block 13, which are separate blocks in this embodiment, may be unified.

The terminal blocks 11 and 13 are so-called screw-less terminal blocks and do not require any screw when the wires are fastened. Thus, the heat generation of the terminals which would be caused by the insufficient fastening or the loose screwing can be suppressed. The terminal block 11 includes a case 67 formed of an insulating material (for example, resin). The case 67 has openings 69 in the front at the positions corresponding to the terminals, and through the openings 69, the wires are inserted. Similarly, the terminal block 13 includes a case 71 formed of an insulating material (for example, resin). The case 71 has openings 73 in the front at the positions corresponding to the terminals, and through the openings 73, the wires are inserted.

Figure 7:
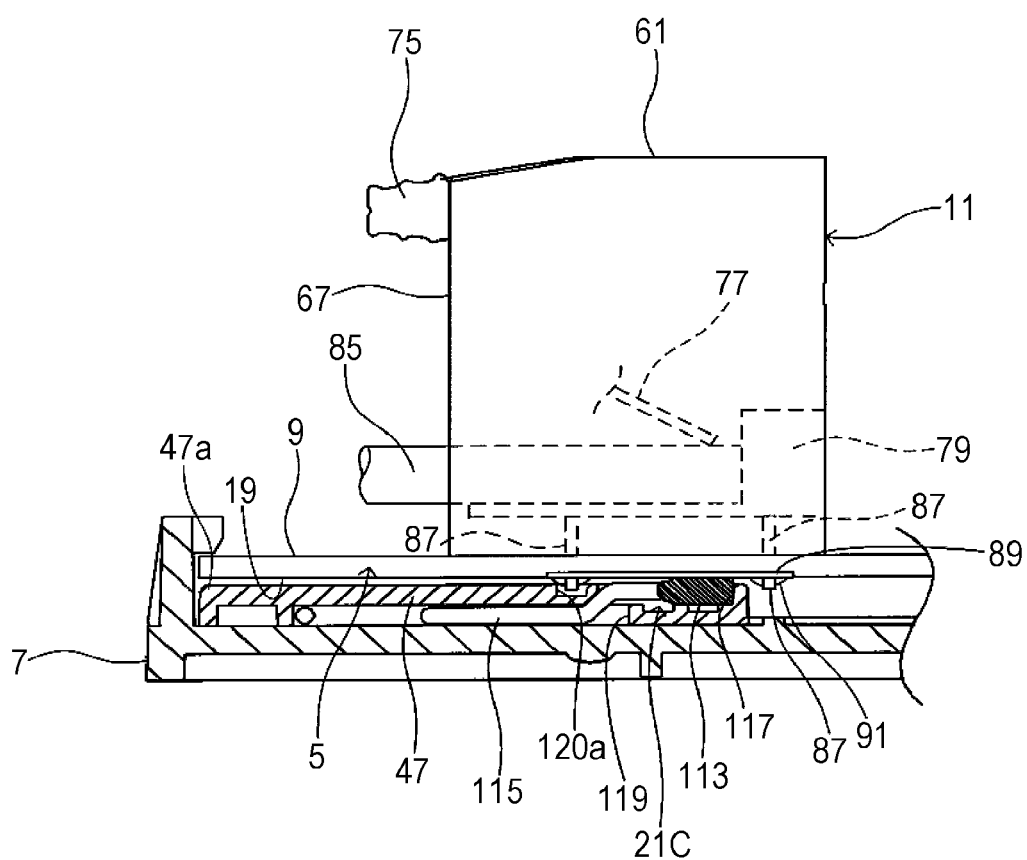
FIG. 7 is an explanatory view illustrating an example of a heat conducting path between the terminal block and the temperature fuse.

The terminals 49, 51, 53, 55, 57, 59, and 61 of the terminal block 11 have substantially the same structure. As illustrated in FIG. 7 to be described below, for example, the terminal 61 includes a lever 75, a plate spring 77, and a conductive plate 79. The lever 75 can rotate relative to the case 67. Pushing down the lever 75 causes an electric wire 85 (conductor part of the lead wire or the like) inserted through the opening 69 to be pressed against the conductive plate 79 with the elastic force of the plate spring 77. This keeps the electric wire 85 and the conductive plate 79 in the contact state. On the other hand, pushing up the lever 75 releases the pressure of the electric wire 85 on the conductive plate 79 applied by the plate spring 77 and the electric wire 85 is therefore released.

The conductive plate 79 is formed of a metal material with high conductivity, such as copper. The conductive plate 79 includes at the bottom, a plurality of conductive pins 87 (in this example, four pins for each terminal) that has been unified. The conductive pins 87 penetrate the printed board 5 from the front surface 9 to the back surface 19. The conductive pins 87 are electrically connected to conductor patterns 89 formed on the back surface 19 with solders 91. The plurality of conductive pins 87 provided for each terminal is thusly fixed through the printed board 5. This causes the terminal block 11 to be fixed to the printed board 5. That is to say, the conductive pins 87 function as the fixing member that fixes the terminal block 11 to the printed board 5. In addition, the conductive pins 87 also function as a conductive member that electrically connects between the conductive plate 79 of the terminal block 11 and the conductor patterns 89 formed on the back surface 19 of the printed board 5.

Figure 8:
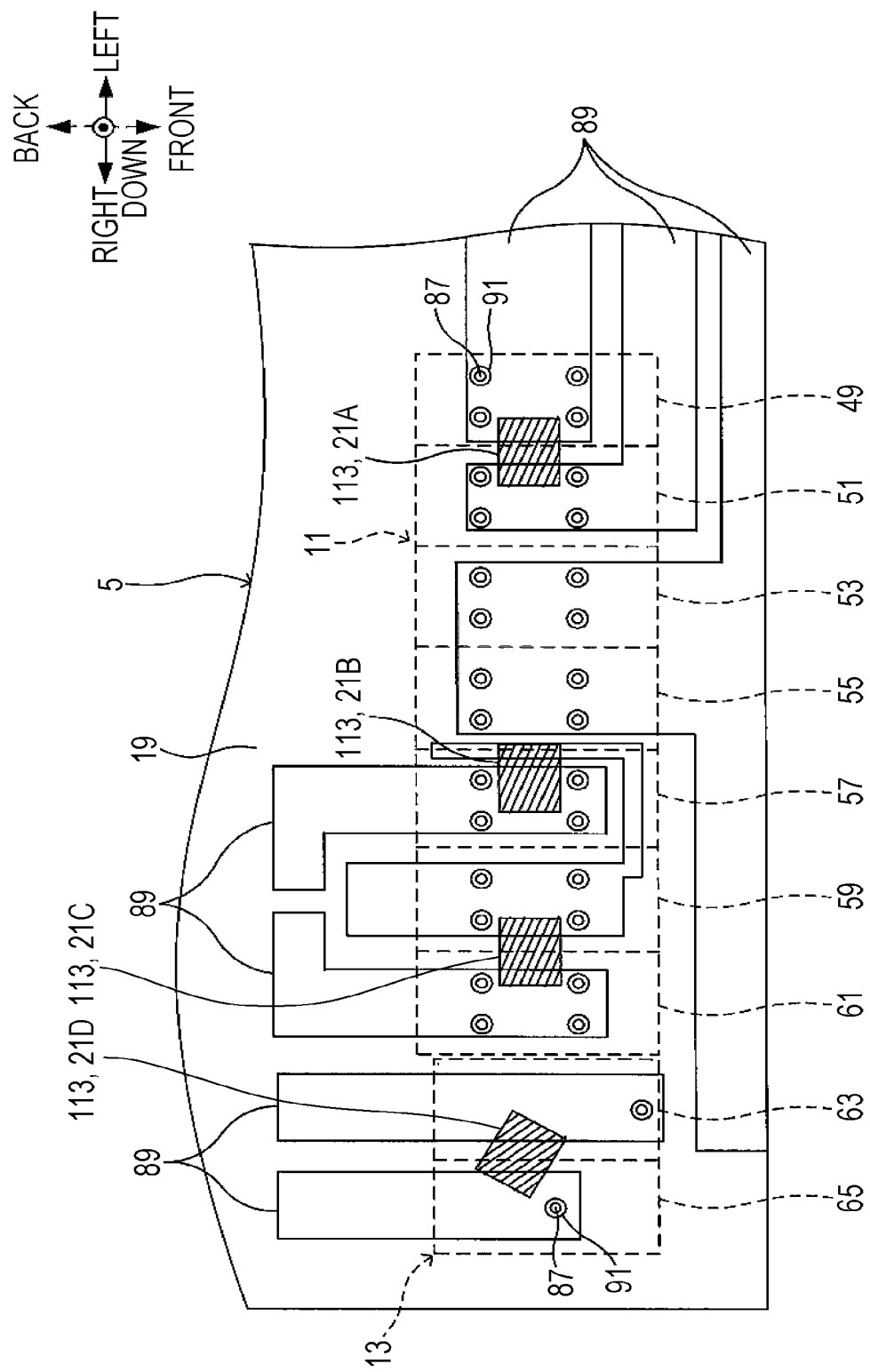
FIG. 8 is an explanatory view illustrating an example of the positional relation between the temperature fuse and a conductor pattern formed on the back surface of the printed board.

Although not shown, the terminals 63 and 65 of the terminal block 13 also have the structure similar to the terminal 61 except that the number of conductive pins of each of the terminals 63 and 65 is one (see FIG. 8). The number of conductive pins of each of the terminals is, however, not limited to a particular number.

As illustrated in FIG. 3, the temperature fuse cover 47 is disposed on the back surface 19 side of the printed board 5 and holds the plurality of temperature fuses 21. The temperature fuse cover 47 is formed of an insulating material (for example, resin). The temperature fuse cover 47 has the size approximately the same as the area where the terminal blocks 11 and 13 are disposed on the front surface 9, and for example, has a shape like a rectangular plate. The temperature fuse cover 47 is attached in a cover installation region 93 of the printed board support bracket 7 so that a board attachment surface 47*a* faces upward. The board attachment surface 47*a* is the surface of the temperature fuse cover 47 that is attached to the printed board 5 (the surface opposite to the back surface 19 of the printed board 5). The cover installation region 93 is formed as a recess with the shape suitable to the temperature fuse cover 47 and the like at the position on a base plate 95 of the printed board support bracket 7 corresponding to the terminal blocks 11 and 13.

The printed board support bracket 7 includes the base plate 95 with, for example, an approximately rectangular shape and a wall 97 surrounding the base plate 95. At each of four corners of the base plate 95 is provided a boss 99 with a screw hole. At the position corresponding to the screw hole of the boss 99 at each of the four corners of the printed board 5, a hole 5*a* is formed. A screw, which is not shown, inserted through the hole 5*a* is screwed into the screw hole of the boss 99. Thus, the printed board 5 is attached to the printed board support bracket 7. In a region on the base plate 95 other than the cover installation region 93 are provided a guide post 101 and a plurality of support projections 103. The guide post 101 positions the printed board 5 by penetrating through a hole of the printed board 5, which is not shown. The plurality of support projections 103 is in contact with the back surface 19 of the printed board 5. Thus, the support projections 103 support the printed board 5 and moreover form the space for installing the temperature fuse cover 47 between the base plate 95 and the printed board 5.

The printed board support bracket 7 has a holder 104, which holds a connector 123 for the temperature fuses 21, on the right end. As illustrated in FIG. 1, an elastic piece 123*a* of the connector 123 is fitted to the holder 104 while being elastically deformed. This allows the connector 123 to be easily detached from the holder 104 from below.

4. Detailed Structure of Temperature Fuse Cover

Figure 4:
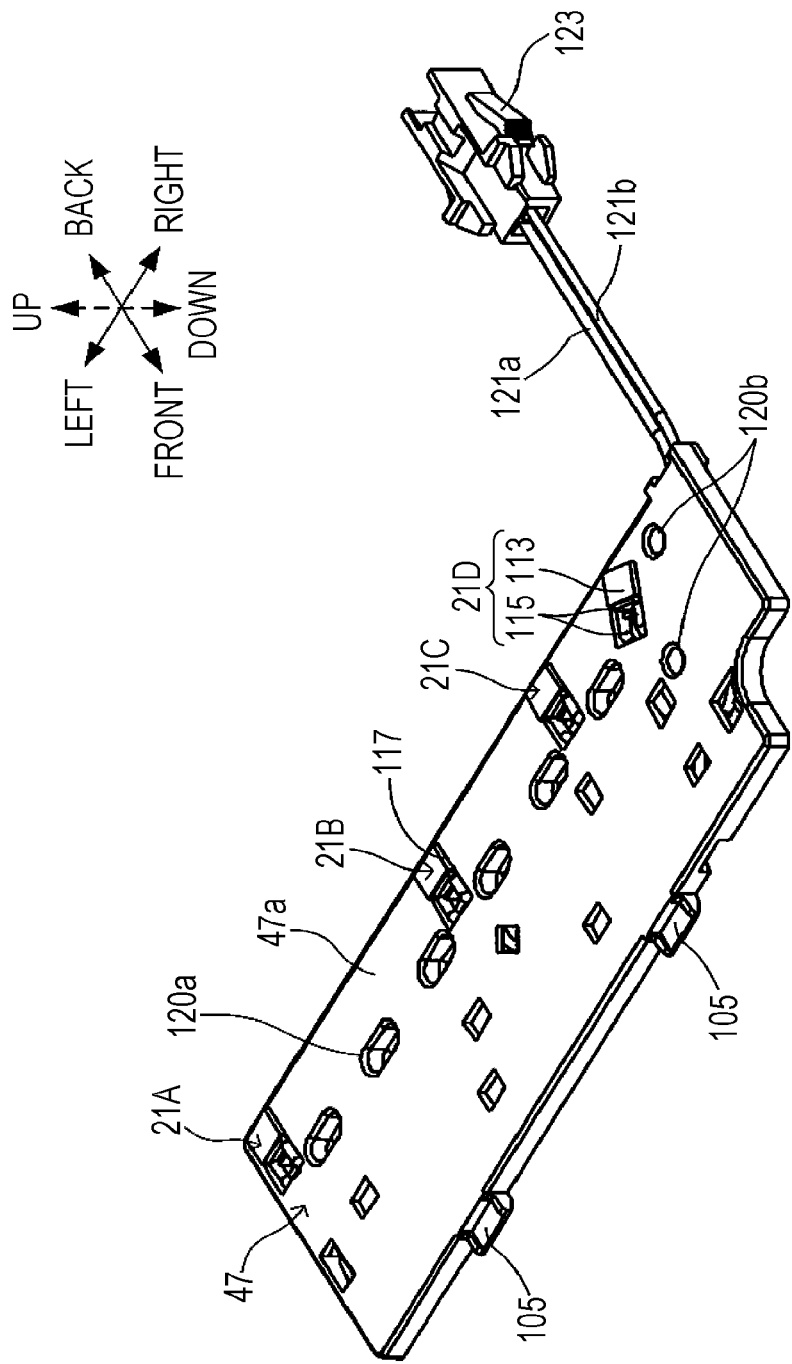
FIG. 4 is a perspective view illustrating an example of a structure of a temperature fuse cover with a temperature fuse attached thereto on a board attachment surface side which is to be attached to the board.
Figure 5:
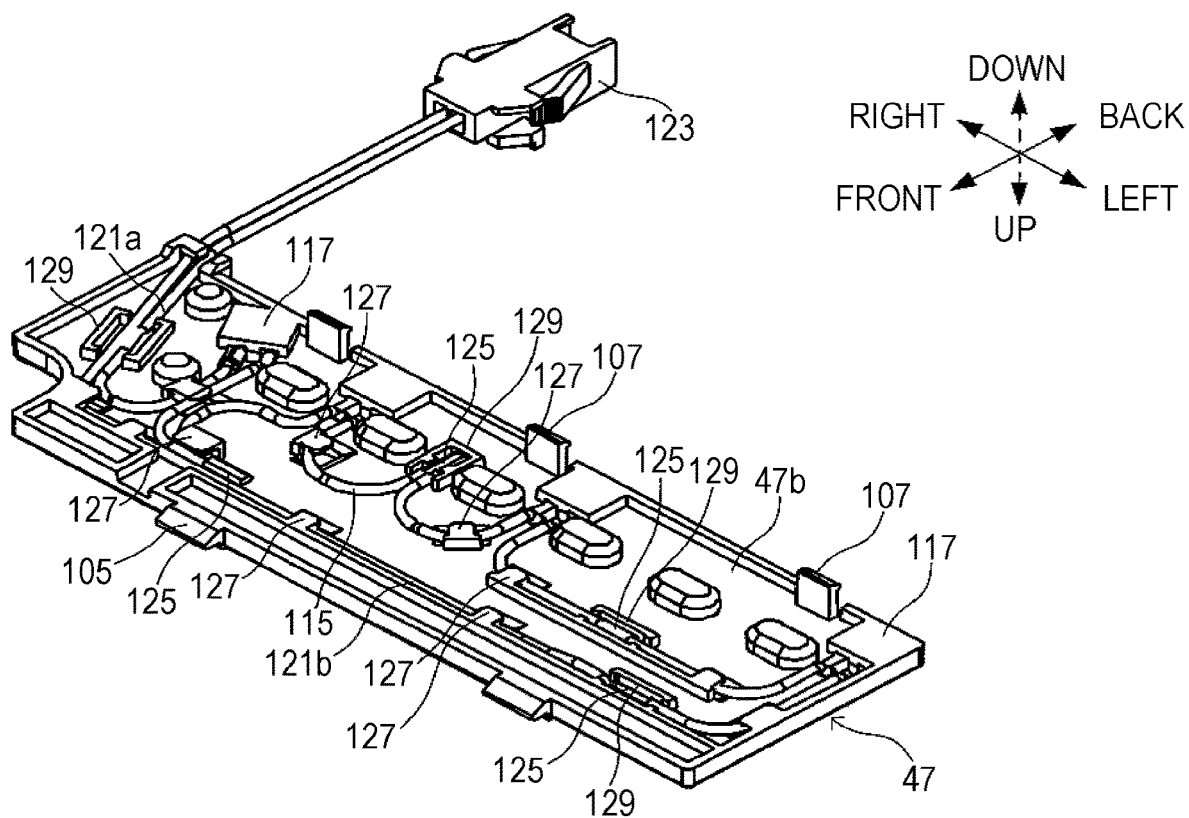
FIG. 5 is a perspective view illustrating an example of a structure of the temperature fuse cover with the temperature fuse attached thereto on a surface side opposite to the board attachment surface side.
Figure 6:
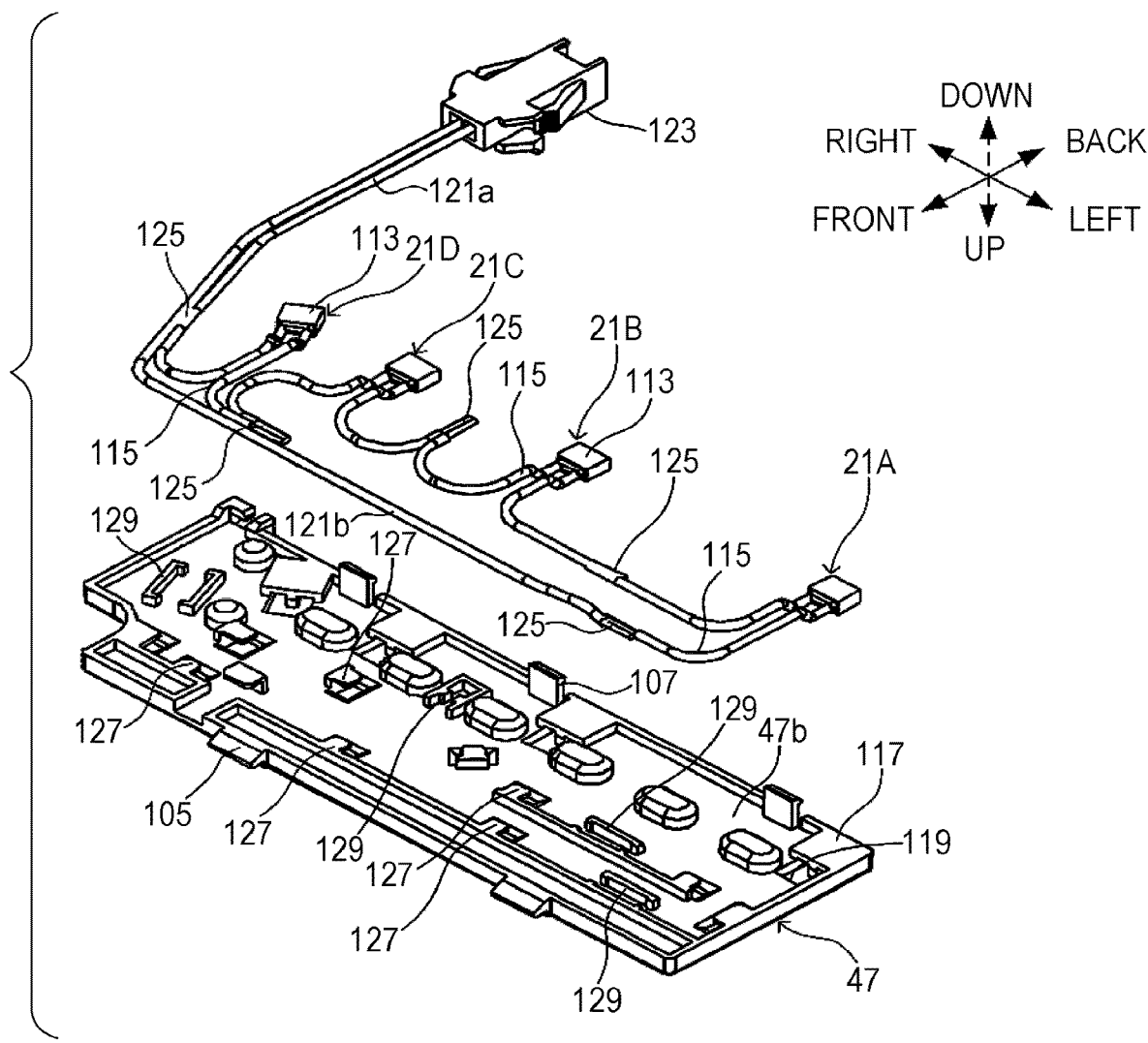
FIG. 6 is an exploded perspective view illustrating an example of the temperature fuse and the structure of the temperature fuse cover on the opposite surface side.

Next, description is made of one example of the detailed structure of the temperature fuse cover 47 with reference to FIGS. 4 to 6.

As illustrated in FIGS. 4 to 6, the temperature fuse cover 47 includes at the front end, a plurality of (in this example, two) projecting pieces 105 that projects frontward. The temperature fuse cover 47 moreover includes a plurality of (in this example, three) projecting pieces 107. The projecting pieces 107 project downward in the rear part of an opposite surface 47*b* opposite to the board attachment surface 47*a* (surface opposite to the base plate 95 of the printed board support bracket 7). In the front end of the cover installation region 93 in the printed board support bracket 7 are formed engagement holes 109 (see FIG. 3). In addition, engagement holes 111 are formed in the rear part of the cover installation region 93. The temperature fuse cover 47 is attached to the printed board support bracket 7 by having each projecting piece 105 inserted into the engagement hole 109 and having each projecting piece 107 inserted into the engagement hole 111.

The temperature fuse cover 47 holds a plurality of (in this example, four) temperature fuses 21 (21A to 21D). The temperature fuses 21 are disposed in the right-left direction in the rear part of the temperature fuse cover 47. The temperature fuse 21 includes a temperature sensing element 113 and two lead wires 115 derived from the temperature sensing element 113. The temperature fuse 21 is the so-called radial type temperature sensor having the temperature sensing element 113 with a flat and rectangular shape. The temperature fuse 21 may be other temperature fuse (for example, axial type) than the radial type.

As illustrated in FIG. 4, the temperature fuse cover 47 holds four temperature fuses 21 in a manner that the temperature sensing element 113 of each temperature fuse 21 is exposed to the upper side, i.e., the back surface 19 side of the printed board 5. The upper surface of the temperature sensing element 113 projects by a small amount over the board attachment surface 47a of the temperature fuse cover 47. This makes the contact more certain between the temperature sensing element 113 and the conductor pattern 89 of the printed board 5.

Of the four temperature fuses 21, a temperature fuse 21A on the leftmost side is disposed at the position corresponding to the input terminals 49 and 51. A temperature fuse 21B on the right side of the temperature fuse 21A is disposed at the position corresponding to the output terminals 57 and 59. A temperature fuse 21C on the right side of the temperature fuse 21B is disposed at the position corresponding to the output terminals 59 and 61. A temperature fuse 21D is disposed oblique to the front-back direction at the rightmost position among the four temperature fuses 21. This temperature fuse 21D is disposed at the position corresponding to the output terminals 63 and 65. In this embodiment, if these temperature fuses 21A to 21D are not distinguished, the simple term "temperature fuses 21" is employed.

In the rear part of the temperature fuse cover 47, a plurality of (in this example, four) housing members 117 (one example of the first positioner) is formed. The housing member 117 has the shape recessed when viewed from the board attachment surface 47a side and projecting when viewed from the opposite surface 47b side. The housing member 117 houses the temperature sensing element 113 of each temperature fuse 21 while exposing the temperature sensing element 113 to the back surface 19 side of the printed board 5. The housing member 117 sets each temperature sensing element 113 at a predetermined position. As illustrated in FIG. 6, a lead-out hole 119 that penetrates through the temperature fuse cover 47 is formed at the position adjacent to the front of the housing member 117. Two lead wires 115 of the temperature fuse 21 are guided to the opposite surface 47b side of the temperature fuse cover 47 through the lead-out hole 119 (also see FIG. 7).

As illustrated in FIG. 4, a plurality of recesses 120a and 120b is formed at the positions corresponding to the terminals on the board attachment surface 47a of the temperature fuse cover 47. The recesses 120a are formed at the positions corresponding to the conductive pins 87 of the terminal block 11. The recesses 120b are formed at the positions corresponding to the conductive pins 87 of the terminal block 13. When the temperature sensing elements 113 of the temperature fuses 21 are brought into contact with the back surface 19 of the printed board 5 as illustrated in FIG. 7, these recesses 120a and 120b avoid the contact between the solders 91 and the plurality of conductive pins 87 projecting from the back surface 19, and the temperature fuse cover 47.

As illustrated in FIG. 6, the four temperature fuses 21A to 21D are connected in series in such a manner as that one of the two lead wires 115 of each fuse 21 is connected to the corresponding one lead wire 115 of the adjacent temperature fuse 21. One of the two lead wires 115 of each of the fuses 21A and 21D on both ends is connected to the connector 123 via each of the connector lead wires 121b and 121a. The lead wires 115 are connected by a connecter 125. In the connector 125, for example, both conductors exposed from the cover are projected in the same direction and are overlapped on each other and bound with a fastener including a sleeve or the like. Alternatively, the conductors exposed from the cover are projected in the opposite directions and are overlapped on each other and bound with a fastener including a sleeve or the like.

As illustrated in FIGS. 5 and 6, a plurality of hooks 127 (one example of the third positioner) with an approximately L-like shape is formed on the opposite surface 47b of the temperature fuse cover 47. Each hook 127 holds the lead wire 115 of the corresponding temperature fuse 21 by hooking the lead wire 115 inwards. Thus, the hooks 127 set the lead wires 115 along the predetermined routes. On the opposite surface 47b, a plurality of holding frames 129 (one example of the second positioner) constituting, for example, a part of the approximately square-shaped frame is formed. Each holding frame 129 contains and holds the corresponding connector 125. Thus, each holding frame 129 sets the connector 125 at the predetermined position while covering the part of the connector 125 on the back surface 19 side of the printed board 5. These hooks 127 and holding frames 129 may be either unified with the temperature fuse cover 47 or provided as separate bodies.

5. Heat Conductive Member

Next, description is made of an example of the structure of the heat conductive members disposed between the temperature fuses 21 and the terminal blocks 11 and 13 with reference to FIGS. 7 and 8. FIG. 7 is a sectional view illustrating a right end face of the terminal block 11. This drawing illustrates the section of the printed board 5, the printed board support bracket 7, the temperature fuse cover 47, and the like. FIG. 8 is an explanatory view expressing the relation between the positions of the conductor patterns 89 formed on the back surface 19 of the printed board 5 and the positions of the temperature fuses 21.

As illustrated in FIGS. 7 and 8, the conductive plate 79 of the terminal 61 of the terminal block 11 includes therebelow a plurality of (in this example, four) conductive pins 87 that has been unified. These conductive pins 87 penetrate through the printed board 5. The conductive pin 87 is electrically connected to the conductor pattern 89 formed on the back surface 19 with the solder 91. The temperature sensing element 113 of each temperature fuse 21 is disposed in contact with the conductor pattern 89. In general, the conductive pins 87 and the conductor patterns 89 are formed of a metal material with high conductivity (for example, copper). The solder 91 is also formed of alloy mainly containing tin, for example. For this reason, the conductive pins 87, the conductor patterns 89, and the solders 91 have high thermal conductivity. For this reason, if the conductive plate 79 generates heat in the terminal 61 due to the jamming of the covering material of the electric wire 85, for example, the conductive pins 87, the solders 91, and the conductor patterns 89 serve as the heat conductive member so that the heat of the conductive plate 79 is transmitted to the temperature sensing element 113 of the temperature fuse 21C efficiently. This similarly applies to other terminals 49, 51, 53, 55, 57, and 59 of the terminal block 11 and the terminals 63 and 65 of the terminal block 13.

That is to say, the temperature fuses 21 are disposed on the back surface 19 of the printed board 5, which is opposite to the front surface 9 where the terminal blocks 11 and 13 are mounted. Thus, the temperature fuses 21 are disposed physically far from the terminal blocks 11 and 13. However, with the heat conductive member including the conductive pins 87, the solders 91, and the conductor patterns 89, the heat can be transmitted to the temperature fuses 21 efficiently. Thus, it can be said that the temperature fuses 21 are disposed thermally close to the terminals of the terminal blocks 11 and 13.

Note that the solder 91 and the conductor pattern 89 correspond to one example of the first heat conductive member disposed between the first electronic component and the temperature sensor. The conductive pin 87 corresponds to one example of the second heat conductive member fixed to the back surface of the printed board with the solder through the printed board.

As described above, the temperature fuses 21 are disposed on the back surface 19 of the printed board 5 at the positions corresponding to the terminal blocks 11 and 13. Now, the term "corresponding position" is described. When a certain electronic component is disposed on a first surface of a printed board, a surface of the printed board opposite to the first surface is a second surface. In this case, the position corresponding to the electronic component refers to the position within a region on the second surface corresponding to the region on the first surface where the electronic component is disposed. More specifically, the position corresponding to the electronic component refers to the position within the region on the second surface including the region overlapping with the region where the electronic component is disposed in a direction parallel to the first surface or the second surface. In this embodiment, the positions corresponding to the terminal blocks 11 and 13 refer to the positions within the range of the back surface 19 corresponding to the region on the front surface 9 where the terminal blocks 11 and 13 are disposed as illustrated in FIG. 8. More specifically, for example, the positions corresponding to the terminal blocks 11 and 13 refer to the positions within the region on the back surface 19 including the region overlapping with the region where the terminal blocks 11 and 13 are disposed in a direction parallel to the front surface 9 or the back surface 19.

The temperature fuses 21A, 21B, 21C, and 21D are disposed at the corresponding positions for each type of terminals of the terminal blocks 11 and 13. That is to say, the temperature fuse 21A is disposed at the position corresponding to the input terminals 49 and 51 on the DC side. The temperature fuse 21B is disposed at the position corresponding to the output terminals 57 and 59 on the AC side. The temperature fuse 21C is disposed at the position corresponding to the output terminals 59 and 61 on the AC side. The temperature fuse 21D is disposed at the position corresponding to the output terminals 63 and 65 on the AC side which are used for the isolated operation.

Specifically, the temperature sensing element 113 of the temperature fuse 21A is disposed across the conductor pattern 89 electrically connected to the input terminal 49 and the conductor pattern 89 electrically connected to the input terminal 51, so that the temperature sensing element 113 is in contact with both conductor patterns 89. This enables the temperature fuse 21A to detect the temperature corresponding to the heat generated in each of the input terminals 49 and 51. Moreover, the temperature sensing element 113 of the temperature fuse 21B is disposed across the conductor pattern 89 electrically connected to the output terminal 57 and the conductor pattern 89 electrically connected to the output terminal 59, so that the temperature sensing element 113 is in contact with both conductor patterns 89. This enables the temperature fuse 21B to detect the temperature corresponding to the heat generated in each of the output terminals 57 and 59. Moreover, the temperature sensing element 113 of the temperature fuse 21C is disposed across the conductor pattern 89 electrically connected to the output terminal 59 and the conductor pattern 89 electrically connected to the output terminal 61, so that the temperature sensing element 113 is in contact with both conductor patterns 89. This enables the temperature fuse 21C to detect the temperature corresponding to the heat generated in each of the output terminals 59 and 61. Moreover, the temperature sensing element 113 of the temperature fuse 21D is disposed across the conductor pattern 89 electrically connected to the output terminal 63 and the conductor pattern 89 electrically connected to the output terminal 65, so that the temperature sensing element 113 is in contact with both conductor patterns 89. This enables the temperature fuse 21D to detect the temperature corresponding to the heat generated in each of the output terminals 63 and 65.

The arrangement of the temperature fuses 21 is not limited to the above-described arrangement. For example, the temperature fuses 21 are not disposed on the conductor patterns 89 electrically connected to the ground terminals 53 and 55. However, the temperature fuses 21 may be disposed for the ground terminals 53 and 55. In addition, one temperature fuse 21 is disposed for a plurality of terminals but the temperature fuse 21 may be disposed for each terminal.

6. Method for Manufacturing Power Conditioner Apparatus

The power conditioner apparatus 1 with the above structure is assembled as below. First, the printed board 5 whose front surface 9 is provided with the terminal blocks 11 and 13 including the plural terminals is prepared. For example, the terminal blocks 11 and 13 including the plural terminals are disposed (installed) on the front surface 9 of the printed board 5. Next, the plurality of temperature fuses 21 that can detect the temperature corresponding to the heat generated in each of the terminal blocks 11 and 13 is attached to the temperature fuse cover 47. Specifically, as illustrated in FIG. 6, the plurality of temperature fuses 21 is connected in series and also connected to the connector 123. After that, the temperature sensing element 113 of each temperature fuse 21 is inserted into the corresponding housing member 117 from the opposite surface 47b side of the temperature fuse cover 47. This causes the temperature sensing element 113 to be exposed to the back surface 19 side of the printed board 5. Each lead wire 115 is hooked by the corresponding hook 127. Each connector 125 is held by the corresponding holding frame 129.

Next, the temperature fuse cover 47 is disposed on the back surface 19 side of the printed board 5 so that each of the plurality of temperature fuses 21 is disposed at the position corresponding to each terminal on the back surface 19 of the printed board 5. Specifically, the temperature fuse cover 47 with the temperature fuses 21 attached thereto is provided in the cover installation region 93 of the printed board support bracket 7 so that the board attachment surface 47a faces upward. Here, the connector 123 is set to the holder 104. After that, the printed board 5 is attached onto the printed board support bracket 7 so that the front surface 9 faces upward and the temperature fuse cover 47 is held between the printed board 5 and the printed board support bracket 7. On the front surface 9 of the printed board 5, the plurality of electronic components including the terminal blocks 11 and 13 is mounted in advance.

After that, the assembly including the printed board support bracket 7, the temperature fuse cover 47, the printed board 5, and the like is housed in the case 3. Thus, the power conditioner apparatus 1 is completed.

7. Effect of Embodiment

As described above, the power conditioner apparatus 1 according to this embodiment includes the printed board 5, the terminal blocks 11 and 13 disposed on the front surface 9 of the printed board 5, and the temperature fuses 21. The temperature fuses 21 are disposed on the back surface 19 of the printed board 5, which is opposite to the front surface 9, and can detect the temperature corresponding to the heat generated in each of the terminal blocks 11 and 13. Here, it is assumed that both the terminal blocks and the temperature fuses are disposed on the front surface of the printed board. In this assumption, the arrangement of other components on the front surface might be restricted and the degree of freedom in designing the board is reduced. In addition, since the temperature fuses, and the conductor patterns or other components need to be set at the distance enough to secure the insulation, the degree of freedom in designing the board is reduced. Moreover, when the temperature fuse is separated from the terminal block, the accuracy of detecting the temperature is decreased. In this embodiment, the temperature fuse 21 is disposed on the back surface 19 side. This can reduce the influence of the temperature fuses 21 on the arrangement of electronic components on the front surface 9. In addition, this can improve the degree of freedom in designing the printed board 5 and increase the temperature detection accuracy.

In this embodiment, particularly, the solders 91 and the conductor patterns 89 are formed between the terminal blocks 11 and 13 and the temperature fuses 21. This provides the effect as below.

With the solders 91 and the conductor patterns 89, the heat of the terminal blocks 11 and 13 disposed on the front surface 9 can be efficiently transmitted to the temperature fuses 21 disposed on the back surface 19. That is to say, the solders 91 and the conductor patterns 89 serving as the heat conductive member allow the temperature fuses 21 to be disposed thermally close to the terminal blocks 11 and 13. As a result, the detection accuracy (heat sensing accuracy) of the temperature fuses 21 can be improved to assure the function of protecting from overheat.

In this embodiment, in particular, the temperature fuses 21 are disposed on the conductor patterns 89 on the back surface 19 of the printed board 5. This provides the effect as below.

In general, the conductor patterns 89 for the printed board 5 are formed of copper or the like with high thermal conductivity. This enables the conductor patterns 89 to be used as the heat conductive member and eliminates the necessity of additionally providing a heat conductive member. Thus, the excellent thermal conductivity can be secured while the increase in cost and number of components is suppressed. The conductor patterns 89 are formed on the back surface 19 to have a planar shape with a predetermined area. Thus, the heat conducting area between the heat conductive member and the temperature fuses 21 is increased. Further, the degree of freedom in arranging the temperature fuses 21 can be improved.

In this embodiment, in particular, the temperature fuses 21 are disposed on the back surface 19 of the printed board 5 at the positions corresponding to the terminal blocks 11 and 13. This can reduce the physical distance between the terminal blocks 11 and 13 and the temperature fuses 21. Thus, the heat resistance can be reduced and therefore the detection accuracy (sensing accuracy) of the temperature fuses 21 can be improved more.

In this embodiment, particularly, the terminal blocks 11 and 13 have the conductive pins 87. The conductive pins 87 are fixed to the back surface 19 by the solders 91 through the printed board 5. The conductive pins 87 are formed of the conductive material and have relatively high thermal conductivity. This eliminates the necessity of additionally providing a heat conductive member because the conductive pins 87 are used as the heat conductive member. Thus, the excellent thermal conductivity can be secured while the increase in cost and number of components is suppressed.

In this embodiment, particularly, the conductive pins 87 serving as the fixing member that fixes the terminal blocks 11 and 13 to the printed board 5 are used as the heat conductive member. This allows the fixing member to also serve as the heat conductive member. As a result, the excellent thermal conductivity can be secured while the increase in cost and number of components is suppressed.

In this embodiment, in particular, the conductive pins 87, which serve as the conductive member that electrically connects between the terminal blocks 11 and 13 and the conductor patterns 89 formed on the back surface 19 of the printed board 5, are used as the heat conductive member. This allows the conductive member to also serve as the heat conductive member. Thus, the excellent thermal conductivity can be secured while the increase in cost and number of components is suppressed.

In this embodiment, in particular, the solders 91 and the conductor patterns 89 are formed of the metal material. The metal material generally has high thermal conductivity. Therefore, the detection accuracy (heat sensing accuracy) of the temperature fuses 21 can be improved.

In this embodiment, in particular, the electronic component whose temperature is detected by the temperature fuse 21 is the terminal blocks 11 and 13 including the plural terminals. The temperature fuses 21 are disposed on the back surface 19 at the positions corresponding to the terminals. Thus, the effect as below can be obtained.

That is to say, in some cases, the terminal of the terminal block generates heat. For example, in the case of the screw type terminal block, the heat generation occurs if the screw is not fitted sufficiently or the screw is loosened, for example. In the case of the screw-less terminal block, the heat generation occurs when the cover of the electric wire is jammed, for example. The overheat protection of the terminal block is executed by stopping the operation of the power conditioner apparatus if the terminal has a predetermined temperature or more. If the terminal block incorporates the temperature sensor such as the temperature fuse, the terminal block exclusively used for the power conditioner apparatus is employed. This leads to the higher cost. Since this terminal block is exclusively used for that power conditioner apparatus, the components are not very versatile.

In this embodiment, the temperature fuses 21 are externally attached to the terminal blocks 11 and 13. This enables to use the versatile products as the terminal blocks 11 and 13, thereby reducing the cost. Moreover, the externally attached temperature fuses 21 can be commonly used among the different terminal blocks, so that the versatility of the components can be improved.

On the other hand, in another structure, the temperature fuses are externally attached to the surface of the terminal block. In this case, the space for this arrangement may restrict the arrangement of the electronic components on the front surface of the printed board. Further, for example, if the electronic components (such as a switching element) for the inverter circuit or the like, which would produce the noise, are formed on the front surface, the detection signal of the temperature fuse may be affected by the noise.

In this embodiment, the temperature fuses 21 are disposed on the back surface 19 of the printed board 5. As described above, the degree of freedom in designing the printed board 5 can be improved. In addition, the temperature fuses 21 can be physically set apart from the electronic components which would produce the noise, such as the system interconnection inverter 39. Thus, the influence of the noise on the detection signal can be reduced.

In this embodiment, in particular, the temperature sensor that detects the temperature corresponding to the heat generated in each of the terminal blocks 11 and 13 is the temperature fuse 21 including the temperature sensing element 113. The temperature sensing element 113 is disposed on the back surface 19 at the position corresponding to the terminal. Thus, the effect as below is provided.

That is to say, the temperature sensor that detects the temperature corresponding to the heat generated in each of the terminal blocks 11 and 13 may be, for example, a temperature fuse or a thermistor. If the thermistor is used and there is a plurality of detection points, a plurality of thermistors is provided as a parallel circuit and the resistance values of the thermistors are independently detected. This complicates the circuit structure.

In this embodiment, the temperature fuse 21 is used as the temperature sensor. Therefore, if there are plural detection points, the circuit having the plural temperature fuses 21 connected in series is formed to detect whether the conduction of the circuit is blocked or not. This can simplify the circuit structure.

In another example, the terminal block incorporating the temperature fuse may be used. In this case, the incorporated temperature fuse may blow by the heat generated when the terminal block is soldered to the printed board 5. In this embodiment, the temperature fuses 21 can be attached after the terminal blocks 11 and 13 are fixed to the printed board 5. Thus, the blowing of the temperature fuse 21 due to the heat generated in attaching the terminal blocks 11 and 13 can be suppressed.

In this embodiment, in particular, the power conditioner apparatus 1 includes the temperature fuse cover 47 formed of the insulating material. The temperature fuse cover 47 is disposed on the back surface 19 of the printed board 5 and holds the plural temperature fuses 21. The temperature fuse cover 47 holds the plural temperature fuses 21 so that the temperature sensing element 113 of the temperature fuse 21 is exposed to the back surface 19 side and so that the back surface 19 side of the connector 125 connecting between the lead wires 115 of the plural temperature fuses 21 is covered. This provides the effect as below.

The electric circuits of the control system including the temperature fuses 21 are insulated from the electric circuits of the power source system including the terminal blocks 11 and 13. In particular, the conductor in the connector 125 connecting between the lead wires 115 of the plural temperature fuses 21 is exposed from the cover. Thus, it is preferable to insulate between the connector 125 and the back surface 19 where the conductive pins 87 and the solders 91 are disposed and the conductor patterns 89 and the like are formed.

The temperature fuse cover 47 exposes the temperature sensing element 113 of the temperature fuse 21 to the back surface 19 side. The temperature fuse cover 47 covers the back surface 19 side of the connector 125 of the lead wire 115. This can secure the temperature detection function of the temperature sensing element 113 and the insulation between the connector 125 and the back surface 19. Thus, the power conditioner apparatus 1 can have higher reliability.

Moreover, by preparing the temperature fuse cover 47 in accordance with the type of terminal blocks 11 and 13, the versatile temperature fuse 21 can be used commonly among the different terminal blocks. The temperature fuse cover 47 costs much less than the temperature fuse incorporated terminal block. Thus, the cost can be reduced drastically as compared to the case of using the temperature fuse incorporated terminal block exclusively used for each power conditioner apparatus 1.

In this embodiment, in particular, the temperature fuse cover 47 includes the plurality of housing members 117, the plurality of holding frames 129, and the plurality of hooks 127. The plurality of housing members 117 sets the temperature sensing elements 113 of the temperature fuses 21 at the predetermined positions. The plurality of holding frames 129 sets the plurality of connectors 125 at the predetermined positions while covering the back surface 19 side of the connectors 125. The plurality of hooks 127 sets the lead wires 115 of the plural temperature fuses 21 along the predetermined routes.

Thus, the temperature sensing elements 113, the connectors 125, and the route of the lead wires 115 of the temperature fuses 21 can be set to the predetermined positions. This achieves the higher detection accuracy of the temperature sensing element 113 and the higher reliability of the insulation, and makes it more certain to hold the temperature fuses 21.

In this embodiment, in particular, the power conditioner apparatus 1 includes the electronic components such as a varistor, a fuse, and an arrester on the front surface 9 of the printed board 5. These electronic components form the AC-side surge suppression circuit 17 and the DC-side surge suppression circuit 15 disposed close to the terminal block 1I. Thus, the effect as below can be obtained.

For example, the surge suppression circuit suppresses the surge by thunder or the like (overcurrent or overvoltage). It is preferable that this surge suppression circuit is disposed close to the terminal block 11 to which the surge is input from the outside from the viewpoint of protecting the circuits in the power conditioner apparatus 1.

In this embodiment, the temperature fuses 21 are disposed on the back surface 19 side as described above. This improves the degree of freedom in designing the printed board 5. Thus, the electronic components included in the surge suppression circuits 15 and 17 can be disposed close to the terminal block 11. This can enhance the surge suppression effect.

As described above, a method for manufacturing the power conditioner apparatus 1 according to this embodiment includes: preparing the printed board 5 whose front surface 9 is provided with the terminal blocks 11 and 13 including the plural terminals; attaching the plural temperature fuses 21 to the temperature fuse cover 47; and disposing the temperature fuse cover 47 on the back surface 19 side of the printed board 5. The plural temperature fuses 21, for example, each detect the temperature corresponding to the heat generated in each of the terminal blocks 11 and 13.

In this embodiment, the plural temperature fuses 21 can be detached at one time by having the temperature fuse cover 47 detached from the printed board 5. This facilitates the work of attaching and detaching the temperature fuses 21.

8. Modified Example

The embodiment to be disclosed herein is not limited to the above embodiment. The embodiment according to the present disclosure can be variously modified within the range not departing from the content and technical thought. Modified examples will be described below.

8-1. Without the Printed Board Support Bracket

Figure 9:
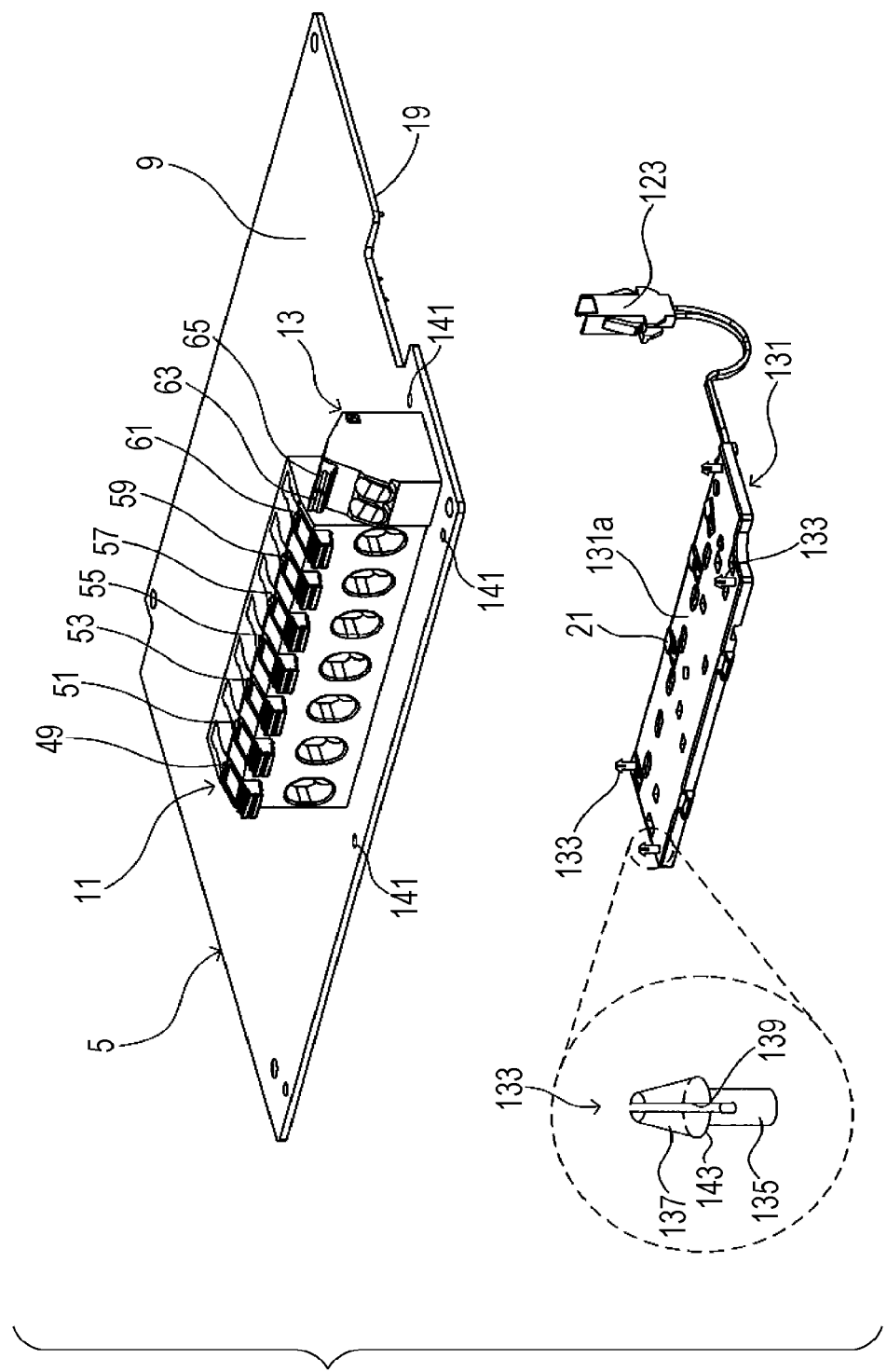
FIG. 9 is a perspective view illustrating one modified example in which the temperature fuse cover is directly fixed to the back surface side of the printed board.

In the above embodiment, the temperature fuse cover 47 having the temperature fuses 21 is attached to the printed board support bracket 7 supporting the printed board 5, so that the temperature fuses 21 are disposed on the back surface 19 side of the printed board 5. However, the temperature fuse cover may alternatively be fixed directly to the back surface 19 side of the printed board 5 without the use of the printed board support bracket 7. An example of this modified example is shown in FIG. 9. In FIG. 9, the structure similar to that of FIG. 3 is denoted by the same reference symbol and the description to such a structure is omitted.

As illustrated in FIG. 9, a temperature fuse cover 131 according to this modified example includes couplers 133 provided standing at four corners of a front surface 131*a*. The coupler 133 is, for example, a solid columnar body as illustrated in a magnified view in FIG. 9, and includes a cylinder 135 and an engagement projection 137 shaped like a truncated cone and provided at an upper end of the cylinder 135. The coupler 133 is provided with a notch-like groove 139 ranging from an upper end of the engagement projection 137 to an upper part of the cylinder 135. With the groove 139, the engagement projection 137 has the elasticity.

In this modified example, the temperature fuse cover 131 is directly attached to the back surface 19 side of the printed board 5. This enables the temperature fuses 21 to be disposed on the back surface 19 side of the printed board 5. Specifically, at four corners of the region on the printed board 5 where the terminal blocks 11 and 13 are disposed, penetration holes 141 are formed. Through these penetration holes 141, the couplers 133 at the four corners of the temperature fuse cover 131 are inserted from the back surface 19 side. Here, the coupler 133 has the engagement projection 137 penetrate through the penetration hole 141 while the projection elastically deforms. In addition, the engagement projection 137 has its lower surface 143 engaged with the periphery of the penetration hole 141 of the printed board 5 on the front surface 9. This causes the coupler 133 to be coupled to the printed board 5. Thus, the temperature fuses 21 installed in the temperature fuse cover 131 can be disposed on the back surface 19 of the printed board 5 at the positions corresponding to the terminal blocks 11 and 13. The printed board 5 with the temperature fuse cover 131 attached thereto is supported by an appropriate support member provided in the case 3 of the power conditioner apparatus 1.

The structure of the temperature fuse cover 131 other than the above-described structure is similar to that of the temperature fuse cover 47.

In this modified example, the printed board support bracket 7 is unnecessary. Thus, the power conditioner apparatus 1 can be reduced in size.

8-2. Others

In the aforementioned example, the electronic component whose temperature is detected by the temperature fuse is the terminal block. However, the electronic components as a detection target is not limited to the terminal block. The electronic components as a detection target may be any electronic component that may generate heat, such as a capacitor, a switching element, a reactor, or a CPU. The embodiment to be disclosed herein is particularly effective when the detection target is the electronic component which unexpectedly generates heat in the occurrence of defective connection, such as the relay (system interconnection relay 43) or the connector.

In the above example, the temperature fuse is used as the temperature sensor that can detect the temperature corresponding to the heat generated in the electronic component. However, the temperature sensor other than the temperature fuse (for example, thermistor) may alternatively be used.

In the above example, the power conversion apparatus is the power conditioner apparatus. The power conversion apparatus is, however, not limited to the power conditioner apparatus. The power conversion apparatus may be, for example, other power conversion apparatus such as an inverter or a converter. In addition, the power conversion apparatus may be any electric appliance including the printed board with the electronic components disposed thereon, for example, the controller that controls a motor, a robot, or the like.

In the above description, the terms "vertical", "parallel", "planar", etc. are not intended to be interpreted strictly. The terms "vertical", "parallel", "planar", etc. allow the tolerance and the error in the design and manufacture, and refer to "substantially vertical", "substantially parallel", "substantially planar", etc., respectively.

In the above description, the terms "the same", "equal", "different", etc. in regard to the external dimension and size are not intended to be interpreted strictly. The terms "the same", "equal", "different", etc. allow the tolerance and the error in the design and manufacture, and refer to "substantially the same", "substantially equal", "substantially different", etc., respectively.

The techniques according to the above described embodiment and modified examples may be combined as appropriate.

Although not described herein, the embodiment and the modified examples may be variously changed in the range not departing from the content thereof.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A power conversion apparatus comprising:
   a board;
   a first electronic component enclosed in a housing and disposed on a first surface of the board; and
   a temperature sensor disposed on a second surface of the board which is opposite to the first surface,
   wherein the temperature sensor is disposed on the second surface at a position directly opposite at least a portion of the housing of the first electronic component,
   wherein a straight line perpendicular to the board intersects both the housing of the first electronic component and the temperature sensor.

2. The power conversion apparatus according to claim 1, further comprising a first heat conductive member disposed between the first electronic component and the temperature sensor.

3. The power conversion apparatus according to claim 2, wherein
the first heat conductive member includes a conductor pattern formed on the second surface of the board, and
the temperature sensor is disposed on the conductor pattern on the second surface.

4. The power conversion apparatus according to claim 1, wherein the first electronic component includes a second heat conductive member fixed to the first surface through the board.

5. The power conversion apparatus according to claim 4, wherein the second heat conductive member includes a fixing member that fixes the first electronic component to the board.

6. The power conversion apparatus according to claim 4, wherein the second heat conductive member includes a conductive member that electrically connects between the first electronic component and the conductor pattern formed on the second surface of the board.

7. The power conversion apparatus according to claim 1, wherein
the first electronic component is a terminal block including a plurality of terminals, and
the temperature sensor is disposed on the second surface at a position opposite each terminal.

8. The power conversion apparatus according to claim 7, wherein
the temperature sensor is a temperature fuse including a temperature sensing element, and
the temperature sensing element is disposed on the second surface at a position opposite each terminal.

9. The power conversion apparatus according to claim 8, further comprising
a temperature fuse cover that is disposed on the second surface side of the board, holds a plurality of the temperature fuses, and is formed of an insulating material, wherein
the temperature fuse cover holds the plurality of temperature fuses so that the temperature sensing element of each temperature fuse is exposed to the second surface side and so that the second surface side of a connector connecting between lead wires of the plurality of temperature fuses is covered.

10. The power conversion apparatus according to claim 9, wherein
the temperature fuse cover includes:
a plurality of first positioners that sets the temperature sensing element of each of the plurality of temperature fuses at a predetermined position while exposing the temperature sensing element to the second surface side;
a plurality of second positioners that each sets each of a plurality of connectors at a predetermined position while covering the second surface side of the plurality of connectors; and
a plurality of third positioners that each sets the lead wires of each of the plurality of temperature fuses along a predetermined route.

11. The power conversion apparatus according to claim 7, further comprising, on the first surface of the board, a second electronic component included in a surge suppression circuit that is disposed adjacent to the terminal block.

12. A method for manufacturing a power conversion apparatus, comprising:
preparing a board including a first surface provided with a terminal block including a plurality of terminals each enclosed in a housing;
attaching a plurality of temperature fuses to a temperature fuse cover; and
disposing the temperature fuse cover on a second surface side of the board, which is opposite to the first surface, so that each of the plurality of temperature fuses is disposed on the second surface of the board at a position directly opposite respective housings of the plurality of terminals, wherein a straight line perpendicular to the board intersects both a temperature fuse of the plurality of temperature fuses and a corresponding opposite housing of the respective housings of the plurality of terminals.

13. An electric appliance comprising:
a board;
a first electronic component enclosed in a housing and disposed on a first surface of the board;
a converter that converts DC power into AC power; and
a temperature sensor disposed on a second surface of the board which is opposite to the first surface,
wherein the temperature sensor is disposed on the second surface at a position directly opposite at least a portion of the housing of the first electronic component, wherein a straight line perpendicular to the board intersects both the housing of the first electronic component and the temperature sensor.

* * * * *